(12) United States Patent
Briar et al.

(10) Patent No.: US 6,355,199 B1
(45) Date of Patent: Mar. 12, 2002

(54) METHOD OF MOLDING FLEXIBLE CIRCUIT WITH MOLDED STIFFENER

(75) Inventors: John Briar; Raymundo M. Camenforte, both of Singapore (SG)

(73) Assignee: St. Assembly Test Services Pte Ltd, Singapore (SG)

( * ) Notice: Subject to any disclaimer, the term of this patent is extended or adjusted under 35 U.S.C. 154(b) by 0 days.

(21) Appl. No.: 09/249,251

(22) Filed: Feb. 12, 1999

(51) Int. Cl.[7] .................. B29C 45/02; B29C 45/14; B29C 70/70
(52) U.S. Cl. .............. 264/272.13; 264/272.14; 264/272.15; 264/272.17
(58) Field of Search .............. 264/272.11, 272.13, 264/272.14, 272.15, 272.17; 29/841, 832, 842; 425/116, 123, 543, 544

(56) References Cited

U.S. PATENT DOCUMENTS

| | | | |
|---|---|---|---|
| 3,797,138 A | * 3/1974 | Closson, Jr. ............. 36/68 |
| 5,241,133 A | 8/1993 | Mullen, III et al. ........ 174/52.4 |
| 5,397,921 A | * 3/1995 | Karnezos ................. 257/779 |
| 5,409,865 A | * 4/1995 | Karnezos ................. 437/210 |
| 5,506,756 A | 4/1996 | Haley ..................... 361/789 |
| 5,635,671 A | 6/1997 | Freyman et al. ........... 174/52.2 |
| 5,835,355 A | * 11/1998 | Dordi ..................... 361/760 |
| 5,852,870 A | * 12/1998 | Freyman et al. ............ 29/841 |
| 5,859,475 A | * 1/1999 | Freyman et al. ........... 257/738 |
| 5,868,887 A | * 2/1999 | Sylvester et al. ...... 264/272.17 |
| 5,882,459 A | * 3/1999 | Petefish .................. 156/150 |
| 6,027,590 A | * 2/2000 | Sylvester et al. ...... 264/272.17 |
| 6,309,575 B1 | * 10/2001 | Boutin et al. .......... 264/272.17 |

* cited by examiner

Primary Examiner—Angela Ortiz
(74) Attorney, Agent, or Firm—George O. Saile; Stephen B. Ackerman; Larry J. Prescott

(57) ABSTRACT

A molded flexible circuit assembly and method of forming a molded flexible circuit assembly which use a molded stiffener, and do not require any additional type of stiffener, are described. A molded stiffener is formed on a flexible tape at the same time molded encapsulation units are formed to encapsulate circuit die which are attached to the flexible tape. The molded stiffeners provide adequate rigidity for processing of the molded flexible circuit assembly. When the stiffeners are no longer needed they are removed at the same time the mold runners are removed. No additional processing steps are required for either the formation or removal of the molded stiffeners.

17 Claims, 3 Drawing Sheets

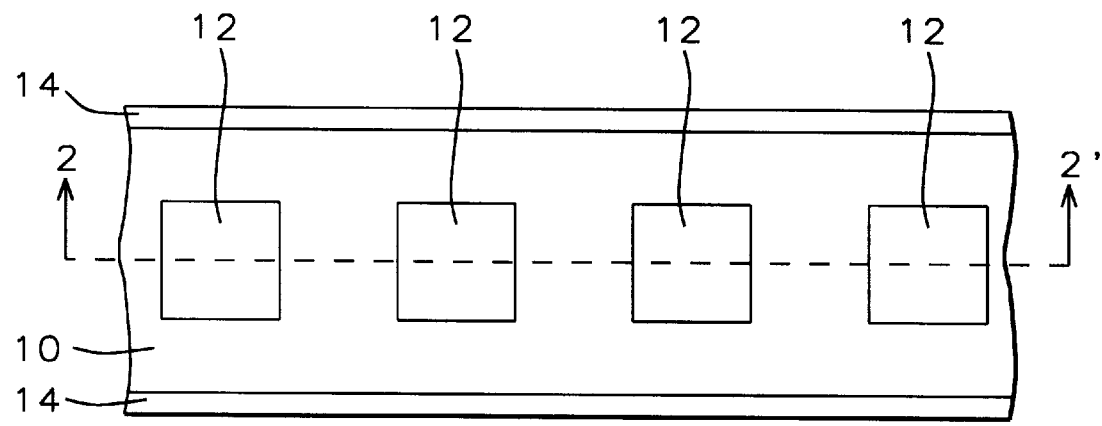
FIG. 1 – Prior Art
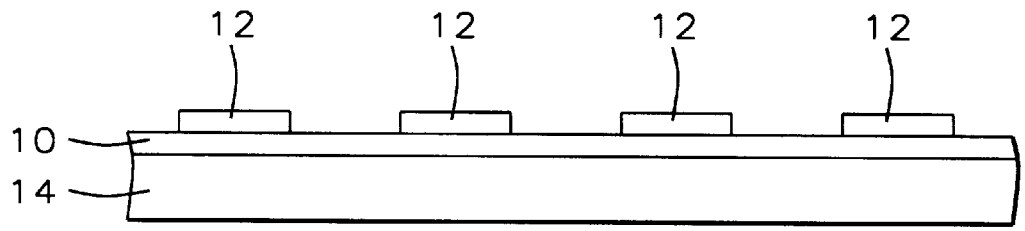
FIG. 2 – Prior Art
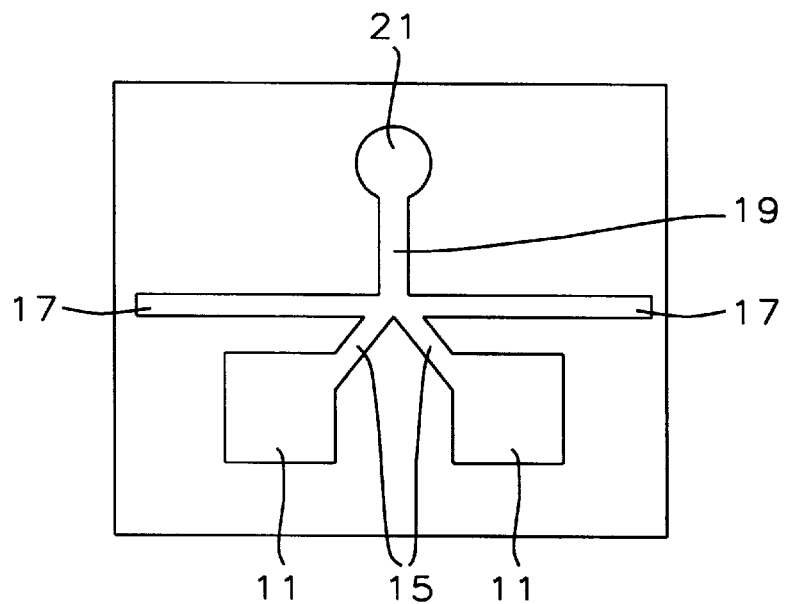
FIG. 3

METHOD OF MOLDING FLEXIBLE CIRCUIT WITH MOLDED STIFFENER

BACKGROUND OF THE INVENTION (1) Field of the Invention

This invention relates to the formation of molded stiffeners which are formed at the same time molded circuit elements are formed.

(2) Description of the Related Art

The processing of molded flexible circuit assemblies requires the use of stiffeners to provide adequate rigidity of the flexible assembly during processing. This invention describes the use of a molded stiffener to accomplish the required rigidity.

U.S. Pat. No. 5,635,671 to Freyman et al. describes encapsulation of an electronic device using injection molding with a two piece mold using a degating region having a material chosen such that the material in the degating region forms a weak bond with the encapsulant used.

U.S. Pat. No. 5,506,756 to Haley describes a ball grid array package containing an integrated circuit die that is directly mounted to either a heat sink or a printed circuit board.

U.S. Pat. No. 5,241,133 to Mullen, III et al. describes a leadless pad array chip carrier package. A semiconductor device is electrically wire bonded and attached with conductive adhesive to a metallized pattern on a printed circuit board.

SUMMARY OF THE INVENTION

Flexible circuits are frequently used in electronic circuit packaging. Molded flexible circuit elements are formed on a flexible tape so that several such circuit elements can be processed simultaneously for such operations as electronic chip attachment, wire bond attachment, and encapsulation. Stiffeners are required to provide adequate rigidity to the flexible circuits for these processing operations.

FIGS. 1 and 2 show a number of flexible circuit elements 12 formed on a flexible tape 10. The detail of the circuit elements 12 is not shown here but the circuit elements typically include a die in a molded encapsulation. A stiffener 14 is attached to the assembly to provide rigidity during the processing operations. These flexible circuit assemblies must use a stiffener 14 to add rigidity during these processing operations and this stiffener which must be removed at the last operation of the process, adding cost and complexity.

It is a principle objective of this invention to provide a method of forming molded flexible circuits which includes a molded stiffener and do not require an additional stiffener to be attached.

It is another principle objective to this invention to provide molded flexible circuits which include molded stiffeners and do not require additional stiffeners to be attached.

These objectives are achieved by using a mold section to form flexible circuit elements on a flexible tape. The mold section includes circuit element cavities, a stiffener cavity, mold runner cavities, and a molding compound cull block. Uncured molding compound is placed in the molding compound cull block and flowed through the mold runner cavities into the circuit element cavities and the stiffener cavity. The molding compound is cured and the mold section removed leaving molded circuit elements and stiffeners formed on the flexible tape. The molded circuit elements, which will be explained in more detail later, include a circuit die and wiring.

The molded stiffeners provide adequate stiffening for subsequent processing operations and no additional stiffeners are required. The molded stiffeners can be used in the processing and are removed when the molded circuit elements are removed from the flexible tape.

BRIEF DESCRIPTION OF THE DRAWINGS

FIG. 1 shows a top view of a conventional flexible circuit assembly with a stiffener attached.

FIG. 2 shows a cross section view of a conventional flexible circuit assembly with a stiffener attached.

FIG. 3 shows a bottom view of a mold section used to form the flexible circuit assembly with stiffeners of this invention.

DESCRIPTION OF THE PREFERRED EMBODIMENTS

Figure 4:
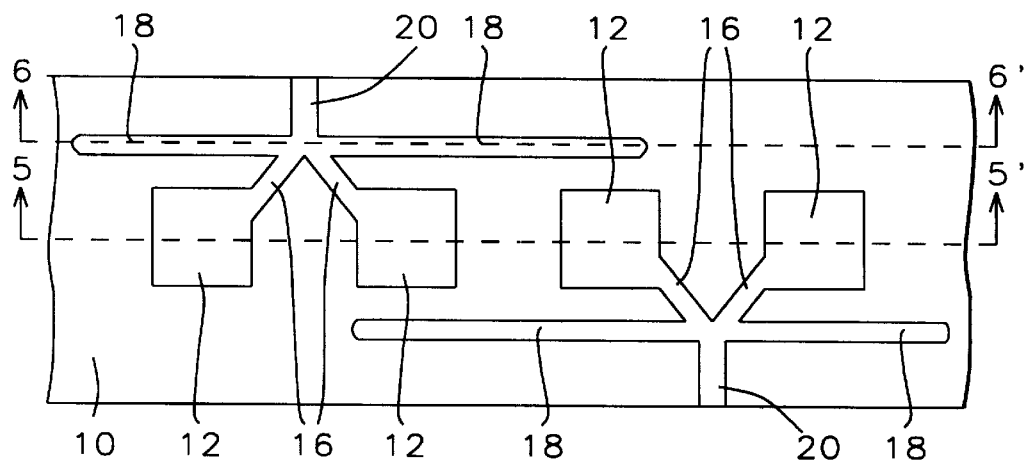
FIG. 4 shows a top view of the flexible circuit assembly with a molded stiffener of this invention.

Refer now to FIGS. 3–6 for a detailed description of the preferred embodiments of the molded flexible circuit assembly of this invention. FIG. 3 shows a bottom view of a mold section which will be used to mold circuit elements and stiffeners for the molded flexible circuit assembly. The mold section has a molding compound cull block 21, a first mold runner cavity 19, a stiffener cavity 17, second mold runner gate cavities 15, and circuit element cavities 11. The molding compound is a material such as a compacted powder in a semicured state which is later cured using time and temperature. Injection molding is described in a Patent Application (ST-98-001) entitled "A DISPOSABLE MOLD RUNNER GATE FOR SUBSTRATE BASED ELECTRONIC PACKAGES", Ser. No. 09/080,106, Filed May 18, 1998, and assigned to the same assignee which is incorporated herein by reference.

Figure 5:
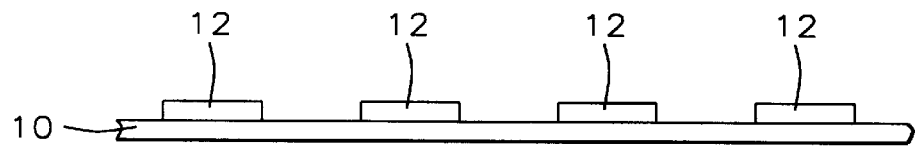
FIG. 5 shows a cross section view of the flexible circuit assembly with a molded stiffener of FIG. 4 along line 5—5' of FIG. 4.

As shown in FIG. 4 the molding compound is then cured using time and temperature, such as between about 125° C. and 190° C. for between about one and two minutes. The mold section is then removed leaving cured molding compound to form a first mold runner 20, a stiffener 18, second mold runners 16, and molded circuit elements 12 formed on the flexible tape 10. Any cured molding compound residue, and any part of the first mold runner 20 not on the flexible tape 10 is removed after the molding is completed. FIGS. 4 and 5 show an example of a mold section providing two circuit elements 12 each, however mold sections having a larger or smaller number of circuit elements, for example one, three, four, or more, can also be used. As can be seen in FIG. 4 the mold section can be used to repeat the pattern of circuit elements any number of times on the flexible tape 10 as desired or needed.

Molded circuit elements 12 and stiffeners 18 are formed on the flexible tape 10. The stiffeners 18 provide rigidity to the molded flexible circuit assembly and no additional stiffeners are required. The molded circuit elements 12 have circuit dies attached, have wiring attached to the circuit dies, and can have via holes formed in the flexible tape depending on the needs of a particular circuit element design. The flexible circuit assemblies have sufficient rigidity supplied by the molded stiffeners 18 for subsequent processing operations such as forming wiring traces on the first or second surfaces of the flexible tape 10 or attachment of circuit dies to the flexible tape 10.

Figure 6:
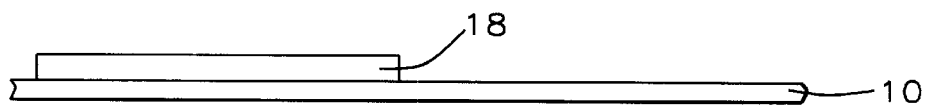
FIG. 6 shows a cross section view of the flexible circuit assembly with a molded stiffener of FIG. 4 along line 6—6' of FIG. 4.
Figure 7:
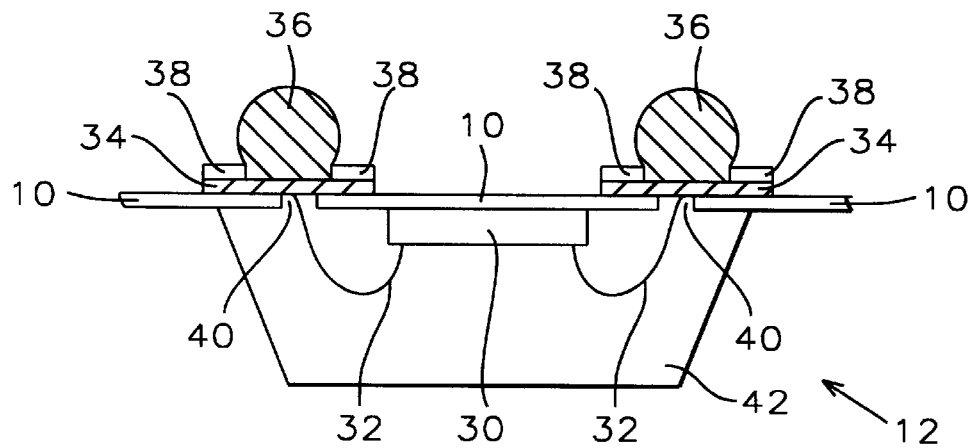
FIG. 7 shows a cross section view of a first example of a circuit element on a flexible tape.
Figure 8:
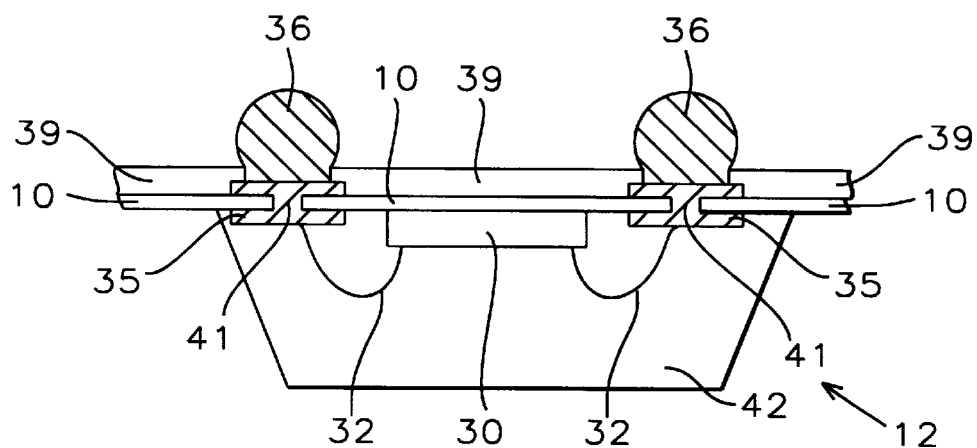
FIG. 8 shows a cross section view of a second example of a circuit element on a flexible tape.

FIG. 4 shows four molded circuit elements 12 on a segment of the flexible tape 10 however more or fewer molded circuit elements 12 and be formed on a segment of flexible tape 10 and processed as a group. FIG. 5 shows a cross section of the flexible circuit assembly along the line 5—5' of FIG. 4 showing molded circuit elements 12 on a segment of flexible tape 10 with no additional stiffener attached to the flexible tape 10. FIG. 5 does not show the wiring and circuit dies of the molded circuit elements. FIGS. 7 and 8 show more detail of examples of molded circuit elements and will be described later. FIG. 6 shows a cross section of the flexible circuit assembly along the line 6—6' of FIG. 4 showing a molded stiffener 18 on a segment of flexible tape 10 with no additional stiffener attached to the flexible tape 10.

The molded stiffeners 18 are formed at the same time the mold runners and molded circuit elements 12 are formed and do not add any processing steps or complexity. The molded stiffeners 18 can be removed from the molded circuit elements 12 at the same time the mold runners are removed after the processing of the molded circuit elements has been completed. The removal of the molded stiffeners 18 does not add any processing steps or complexity to the removal of the mold runners, since the final package form does not normally include mold runners.

Refer now to FIGS. 7 and 8 for a description of some particular examples of molded circuit elements 12. FIG. 7 shows a first example of a molded circuit element 12 having a circuit die 30 attached to the flexible tape 10. The flexible tape 10 is a flexible material such as polyimide or the like. Copper pads 34 are formed on the opposite side of the flexible tape from the circuit die 30. Wire bonds using a material such as gold wire 32 are bonded to the circuit die 30 and to the copper pads 34 through via holes 40 in the flexible tape 10. Solder balls 36 are attached to the copper pads 34 through a solder mask 38 formed of a material not wettable by the solder. The circuit die 30 and gold wire 32 are encapsulated in a molded encapsulant using the molding process described earlier.

FIG. 8 shows a second example of a molded circuit element 12 having a circuit die 30 attached to the flexible tape 10. The flexible tape 10 is a flexible material such as polyimide or the like. Via holes 41 is formed in the flexible tape 10 and copper pads 35 are formed on both sides and in the via holes 41 of the flexible tape 10. Wire bonds using a material such as gold wire 32 are bonded to the circuit die 30 and to the copper pads 35. Solder balls 36 are attached to the copper pads 35 through a solder mask 39 formed of a material not wettable by the solder. The circuit die 30 and gold wire 32 are encapsulated in a molded encapsulant using the molding process described earlier.

These examples have used particular designs of mold sections and molded circuit elements. It will be readily apparent to those skilled in the art that different mold section designs and molded circuit element designs can also be used as long as the designs includes a molded stiffener.

While the invention has been particularly shown and described with reference to the preferred embodiments thereof, it will be understood by those skilled in the art that various changes in form and details may be made without departing from the spirit and scope of the invention.

What is claimed is:

1. A method of molding flexible circuit elements, comprising:

providing a mold section having a molding compound cull block, a first mold runner cavity connected to said molding compound cull block, a stiffener cavity connected to said first mold runner cavity, a number of circuit cavities, a number of second mold runner cavities connected to said first mold runner cavity wherein each of said second mold runner cavities is connected to one of said circuit cavities;

providing a flexible tape;

providing a number of circuit die attached to said flexible tape;

providing a molding compound;

placing said mold section on said flexible tape covering said circuit die;

placing said molding compound in said molding compound cull block of said mold section;

flowing said molding compound through said first Mold runner cavity and said second mold runner cavities into said circuit cavities and said stiffener cavity, thereby covering said circuit die and filling said stiffener cavity with molding compound;

curing said molding compound thereby forming cured molding compound over each of said circuit die and stiffeners of cured molding compound, formed by curing said molding compound in said stiffener cavity, on said flexible tape, wherein said stiffeners of cured molding compound provide stability for said circuit die on said flexible tape; and removing said mold section.

2. The method of claim 1 wherein said molding compound is a heat cured material.

3. The method of claim 1 wherein said molding compound is a compacted powder in a semicured state.

4. The method of claim 1 wherein said flexible tape is polyimide tape.

5. The method of claim 1 wherein said flexible tape is formed of a flexible material.

6. The method of claim 1 wherein said curing said molding compound uses time and temperature.

7. The method of claim 1 wherein said flexible tape has a first surface, a second surface, via holes between said first surface and said second surface, and further comprises electrical traces formed on said first surface or said second surface.

8. A method of molding flexible circuit elements, comprising:

providing a mold section having a molding compound cull block, a first mold runner cavity connected to said molding compound cull block, a stiffener cavity connected to said first mold runner cavity, a number of circuit cavities, a number of second mold runner cavities connected to said first mold runner cavity wherein each of said second mold runner cavities is connected to one of said circuit cavities;

providing a flexible tape wherein said flexible tape has a first surface, a second surface, and via holes between said first surface and said second surface and further comprises electrical traces formed on said first surface and said second surface;

providing a number of circuit die attached to said flexible tape;

providing a molding compound;

placing said mold section on said flexible tape covering said circuit die;

placing said molding compound in said molding compound cull block of said mold section;

flowing said molding compound through said first mold runner cavity and said second mold runner cavities into said circuit cavities and said stiffener cavity, thereby covering said circuit die;

curing said molding compound thereby forming flexible circuit elements and stiffeners on said flexible tape; and removing said mold section.

9. The method of claim 1 wherein no additional means of stiffening said flexible tape is used.

10. The method of claim 1 further comprising separating said flexible circuit elements, including said circuit die, into individual said circuit elements and removing said first mold runners, said second mold runners, and said stiffeners from each of said flexible circuit elements.

11. The method of claim 8 wherein said molding compound is a heat cured material.

12. The method of claim 8 wherein said molding compound is a compacted powder in a semicured state.

13. The method of claim 8 wherein said flexible tape is polyimide tape.

14. The method of claim 8 wherein said flexible tape is formed of a flexible material.

15. The method of claim 8 wherein said curing said molding compound uses time and temperature.

16. The method of claim 8 wherein no additional means of stiffening said flexible tape is used.

17. The method of claim 8 further comprising separating said flexible circuit elements, including said circuit die, into individual said circuit elements and removing said first mold runners, said second mold runners, and said stiffeners from each of said flexible circuit elements.

\* \* \* \* \*